US007034530B2

(12) United States Patent
Ahluwalia et al.

(10) Patent No.: US 7,034,530 B2
(45) Date of Patent: Apr. 25, 2006

(54) TECHNIQUE FOR SIMULTANEOUS ACQUISITION OF MULTIPLE INDEPENDENT MR IMAGING VOLUMES WITH OPTIMIZATION OF MAGNETIC FIELD HOMOGENEITY FOR SPIN PREPARATION

(75) Inventors: Baldev S. Ahluwalia, Milwaukee, WI (US); Cynthia F. Maier, Milwaukee, WI (US); Elisabeth C. Angelos, Hartland, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/185,211

(22) Filed: Jun. 28, 2002

(65) Prior Publication Data

US 2004/0000907 A1    Jan. 1, 2004

(51) Int. Cl.
*G01V 3/00* (2006.01)
(52) U.S. Cl. ................................... 324/309
(58) Field of Classification Search ............... 324/309, 324/307
See application file for complete search history.

(56) References Cited

U.S. PATENT DOCUMENTS

| 5,124,650 | A |   | 6/1992  | Granot |              |
|-----------|---|---|---------|--------|--------------|
| 5,363,845 | A | * | 11/1994 | Chowdhury et al. | 600/422 |
| 5,374,890 | A | * | 12/1994 | Zou et al. | 324/318 |
| 5,590,655 | A | * | 1/1997  | Hussman | 600/426 |
| 5,804,969 | A | * | 9/1998  | Lian et al. | 324/318 |
| 6,023,167 | A | * | 2/2000  | DeMeester et al. | 324/318 |
| 6,100,695 | A |   | 8/2000  | DeMeester et al. | |
| 6,150,816 | A | * | 11/2000 | Srinivasan | 324/318 |
| 6,177,797 | B1| * | 1/2001  | Srinivasan | 324/318 |
| 6,181,134 | B1| * | 1/2001  | Wald | 324/307 |
| 6,249,121 | B1| * | 6/2001  | Boskamp et al. | 324/318 |

(Continued)

FOREIGN PATENT DOCUMENTS

EP    0 616 229 B1    8/1994

OTHER PUBLICATIONS

David J. Larkman, PhD, Joseph V. Hejnal, PhD. Amy H. Herlihy, PhD, Glyn A. Coutts, PhD, Ian R. Young, PhD, and Gosta Ehnholm, Phd, "Use of Multicoil Arrays for Separation of Signal from Multiple Slices Simultaneously Excited," Journal of Magnetic Resonance Imaging 12:313-317 (2001).

(Continued)

*Primary Examiner*—Diego Gutierrez
*Assistant Examiner*—Dixomara Vargas
(74) *Attorney, Agent, or Firm*—Henry Policinski; Joseph S. Heino; Patrick M. Bergin

(57) ABSTRACT

An MR imaging pulse sequence provides a method for simultaneous data acquisition from more than one independently prescribed volume while providing optimized field uniformity during both the magnetization preparation and data acquisition parts of the acquisition. The method is based on the use of a multi-element array coil where individual RF coil elements are more sensitive to one of the separate volumes of interest than to the other volumes. In the example of breast imaging, one scenario would have two coil elements that are designed to be most sensitive to the signal from the left breast, and two coil elements that are designed to be most sensitive to the signal from the right breast. An optimized pulse sequence and reconstruction technique is used to simultaneously acquire two separate sagittal imaging volumes corresponding to the left and right breasts with optimized fat suppression.

12 Claims, 4 Drawing Sheets

U.S. PATENT DOCUMENTS 6,320,377 B1 * 11/2001 Miyazaki et al. ........... 324/306
6,373,249 B1 * 4/2002 Kwok et al. ................ 324/306
6,448,771 B1 * 9/2002 Harvey et al. .............. 324/307

OTHER PUBLICATIONS

David J. Larkman, PhD, Nandita M. deSouza, MD, Mark Bydder, PhD, and Joseph V. Hajnal, PhD, "An Investigation into the Use of Sensitivity-Encoded Techniques to Increase Temporal Resolution in Dynamic Contrast-Enhanced Breast Imaging," Journal of Magnetic Resonance Imaging 14:329-335 (2001).

Glen Morrell and Daniel Speilman, Dynamic Shimming for Multi-Slice Magnetic Resonance Imaging, Department of Electrical Engineering, Stanford University, Stanford, California (G.M.); and the Radiology Department, Stanford University Medical Center, Stanford, California (D.S.), MMR 38:447-483 (1997).

D. H. Kim, D. M. Spielman, D. Baniel, Autimated Bilateral Shimming for Breast MRI, Proc. Intl. Soc. Mag. Reson. Med. 10 (202).

N. A. Bock, N. B. Konyer, and R. M. Henkelman, Multiple-Mouse MRI, Proc. Intl. Soc. Mag. Reson. Med 9 (2001)

Susan G. Orel, MD and Mitchell D. Schnall, MD, MR Imaging of the Breast for the Detection, Diagnosis, and Staging of Breast Cancer, Department of Radiology, Hospital of the University of Pennsylvania, Radiology, vol. 220—No. 1, Jul. 2001.

Robert L. Greeeman, Robert E. Lenkinski and Mitchell D. Schnall, Bilateral Imaging Using Separate Interleaved 3D Volumes and Dynamically Switched Multiple Recieve Coil Arrays, Department of Radiology, University of Pennsylvania Medical Center, Philadelphia, Pennsylvania, MRM 39:108-118 (1998).

* cited by examiner

TECHNIQUE FOR SIMULTANEOUS ACQUISITION OF MULTIPLE INDEPENDENT MR IMAGING VOLUMES WITH OPTIMIZATION OF MAGNETIC FIELD HOMOGENEITY FOR SPIN PREPARATION

BACKGROUND OF THE INVENTION

This invention relates to magnetic resonance (MR) data acquisition. More particularly, it relates to methods for limiting the volume of interest and for simultaneously acquiring multiple imaging volumes during MR studies.

An MR imaging system provides an image of a patient or other object in an imaging volume based on detected radio frequency (RF) signals from precessing nuclear magnetic moments. A main magnet produces a static magnetic field, or $B_0$ field, over the imaging volume. Similarly, gradients coils within the MR imaging system are employed to quickly switch into effect magnetic radiance along mutually orthogonal x, y, z coordinates in the static $B_0$ field during selected portions of an MR imaging data acquisition cycle. Meanwhile, an RF coil produces RF magnetic field pulses, referred to as a $B_1$ field, perpendicular to the $B_0$ field, within the imaging volume to excite the nuclei. The nuclei are thereby excited to precess about an axis at a resonant RF frequency. As the precession occurs into the transverse plane, the transverse component of magnetization is magnetically coupled to some external circuitry, typically a receiver. These transmitter and receiver coupling mechanisms both are called RF coils.

RF antennas or coils are tuned and resonate in a frequency band defined by the Larmor frequency and the presence of a gradient field. The filling factor for RF coils is defined as the volume of sensitivity for a given RF coil. In general, the RF coil should be completely filled by the subject, as to eliminate unwanted noise sensitivity from the larger volume. This filling factor is very important and is inversely proportional to signal to noise ratios (SNR). A transmitter coil or body coil, is designed to be uniformly sensitive over an entire field of view (FOV) as defined by the system. This design provides flexibility for imaging large or small volumes.

Most current MR imaging techniques require separate, sequential acquisitions for each volume of interest when multiple volumes are of interest. This invention describes a technique for simultaneous acquisition of separate volumes of interest from different groups of RF coil elements where each group of coil elements has a higher sensitivity to one particular volume of interest than to the other volumes. This technique allows for individualized shim settings to be used for each volume during the spin preparation part of the imaging sequence. For sequences which have a fat suppression technique as the spin preparation, the ability to use individualized shim settings for each volume is crucial to obtaining good image quality.

For clinical studies using contrast agent where more than one volume is of interest following the injection of the contrast material, currently available three dimensional gradient echo techniques require that the volumes be imaged sequentially, or that a large enough volume is prescribed to encompass both regions. The first alternative results in different contrast characteristics for the volumes, and the possible loss of important early contrast uptake information for the volumes that are acquired later. The second alternative compromises the spatial resolution of the study, and is an inefficient way to acquire data if the regions of interest are not close together. Moreover, since it is often necessary to suppress the signal from fat to improve conspicuity of the areas of contrast agent uptake, the use of a larger volume usually results in compromised fat suppression due to the reduced efficacy of main field correction techniques for larger volumes.

One example of a clinical application where simultaneous acquisition of high-resolution images from separate volumes is desirable is MR breast imaging. Currently, approaches to this problem are: either a sequential acquisition of two sagittal volumes corresponding to the left and right breasts separately, or, acquisition of a single axial or coronal volume that encompasses both breasts. The sagittal orientation is preferred for breast imaging because those images correlate better with mammography, and it offers the most efficient filling of imaged volume with breast tissue. Use of an axial or coronal volume to encompass both breasts compromises the spatial resolution of the image, and is inefficient because it requires the acquisition of data corresponding to the empty space between two breasts. In addition, when imaging both breasts simultaneously with one large FOV, the main field homogeneity corrections applied (shim currents) are set to a single value for both volumes, a compromise that reduces the quality of fat suppression. The quality of fat suppression could be improved by using two different sets of shim currents optimized for the left and right breasts respectively during the corresponding spin preparations. This invention provides a method for simultaneous acquisition of two sagittal volumes, and also incorporates a technique for optimizing the quality of fat suppression (or other spin preparation) over both volumes.

BRIEF SUMMARY OF THE INVENTION

The MR imaging pulse sequence described herein provides a method for simultaneous data acquisition from more than one independently prescribed volume while providing optimized field uniformity during both the magnetization preparation and data acquisition parts of the acquisition. For the acquisition of two volumes simultaneously, the invention may be used to either decrease scan time by as much as a factor of two compared to a sequential acquisition (while maintaining spatial resolution and signal-to-noise ratio or SNR). Alternatively, it can be used to increase spatial resolution by a factor of two with an approximate 10% increase in acquisition time as compared to a single-volume imaging procedure.

The method of the present invention is based on the use of a multi-element array coil where individual RF coil elements are more sensitive to one of the separate volumes of interest than to the other volumes. In the example of breast imaging, one possible scenario would have two coil elements that are designed to be most sensitive to the signal from the left breast, and two coil elements that are designed to be most sensitive to the signal from the right breast. This invention is a method consisting of an optimized pulse sequence and reconstruction technique that allows simultaneous acquisition of two separate sagittal imaging volumes corresponding to the left and right breasts with optimized fat suppression.

DETAILED DESCRIPTION OF THE INVENTION

Figure 1:
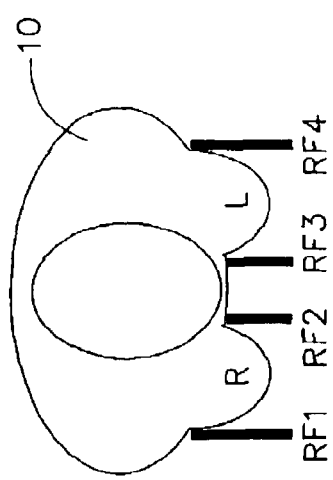
FIG. 1 is a schematic representation of one possible arrangement of RF coil elements compatible with this invention for acquiring sagittal image volumes from left and right breasts simultaneously.

According to a broad aspect of the present invention, the MR imaging pulse sequence described herein provides a method for simultaneous data acquisition from more than one independently prescribed volume while providing optimized field uniformity during both the magnetization preparation and data acquisition parts of the acquisition. For the acquisition of two volumes simultaneously, the method of the present invention may be used to either decrease scan time by almost a factor of 2 compared to a sequential acquisition of the same two volumes. This is accomplished while maintaining spatial resolution and SNR. Accordingly, the method can be used alternatively to increase spatial resolution by a factor of 2 with an approximate 10 percent increase in acquisition time as compared to a single volume imaging procedure. The method of the present invention is based on the use of a multi-element array coil where individual RF coil elements are more sensitive to one of the separate volumes of interest than to the other volumes.

According to a more particular aspect of the present invention as applied to breast imaging, the invention allows the simultaneous acquisition of high-resolution sagittal volumes of the left and right breast. This method allows appropriate timing of the acquisitions relative to the uptake characteristics of the contrast agent and approximately doubles the spatial resolution compared to an axial or coronal volume incorporating both breasts without adding scan time. In addition, it incorporates a technique for improved fat suppression relative to images acquired using a single volume to encompass both breasts. For breast imaging, a spectrally selective inversion recovery based sequence is preferred to null the signal from adipose tissue due to the lengthy acquisition time required for performing chemical fat saturation in a three dimensional sequence. This allows you to control the time point when fat is a null as opposed to chemsat where fat is null at t=0, resulting in greater flexibility in sequence design. For breast imaging, this greater flexibility can be used to decrease the overall acquisition time by increasing the number of k-space lines that can be acquired per fat suppression pulse. The invention provides for the optimization of shim settings for each volume individually during volume-selective fat inversion pulses, and uses an average shim setting for the data acquisition portion of the pulse sequence. The data acquisition portion of the sequence has less stringent requirements for main field homogeneity than the spin preparation portions of the sequence.

Although the specific implementation of the method of this invention is disclosed as being applied to breast imaging, it is to be understood that other clinical applications are possible, including imaging the carotid arteries, shoulders, hips, temporomandibular joints, separate specimens or multiple samples where simultaneous acquisition of multiple volumes is desired.

As alluded to earlier, the method of the present invention is based on the use of a multi-element array coil where individual RF coil elements are more sensitive to one of the separate volumes of interest than to the other volumes. In the example of breast imaging, one possible scenario would have two coil elements that are designed to be most sensitive to the signal from the left breast, and two coil elements that are designed to be most sensitive to the signal from the right breast. It is possible to use an optimized pulse sequence and reconstruction technique to simultaneously acquire two separate sagittal imaging volumes corresponding to the left and right breasts with optimized fat suppression.

Referring now to the drawings in detail, wherein like numbered elements represent like elements throughout, FIG. 1 illustrates one possible arrangement of RF coil elements compatible with this invention for simultaneously acquiring sagittal image volumes from a left breast L and a right breast R. Coil elements RF1 and RF2 are sensitive mainly to the right breast R. Coil elements RF3 and RF4 are sensitive mainly to the left breast L. This property can be used to reconstruct two independent sagittal volumes corresponding to the left and right breasts L, R from a single acquisition. Although the coil elements RF1, RF2, RF3, RF4 are shown as flat surface coils, it is to be understood that the method of this invention is not constrained to use this geometry for the coil elements. It is only necessary that each of the coil elements is more sensitive to one breast than to the other. It is also to be understood that the method of this invention is not limited to only two coil elements per breast or volume, nor are equal numbers of coil elements necessary for each breast or volume.

Figure 2A:
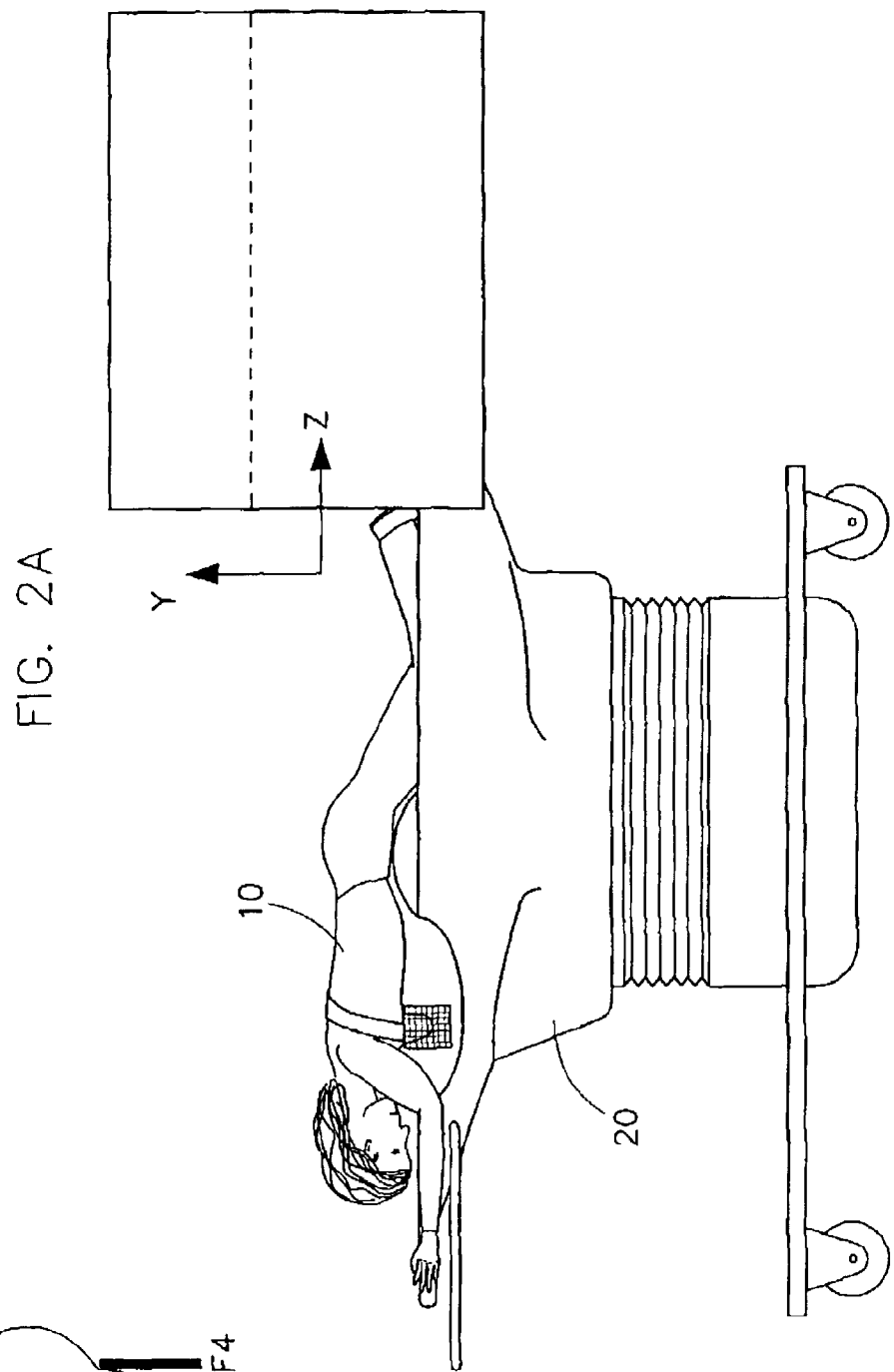
FIG. 2A is a front elevational view of a specific implementation of this invention for breast imaging.

Referring now to FIGS. 2A through 2E, one specific implementation of this invention is illustrated for breast imaging. As shown, the patient 10 assumes a prone position on a gurney 20 that is specifically utilized for allowing breast imaging in that position. Two independent sagittal volumes are prescribed, with one volume corresponding to the patient's left breast L, and the other volume corresponding to the patient's right breast R. Alternatively, a single, thick sagittal volume could be prescribed to encompass both breasts with reference points defined to demarcate the medial boundaries of the left and right volumes. As shown in FIG. 2A, the orientation of the logical gradient axes is shown for the pulse sequence description that follows. The slice-encoding axis is along the L/R direction and the in-plane axes are the S/I and A/P directions, however, the frequency axis can be either A/P or S/I.

Figure 2B:
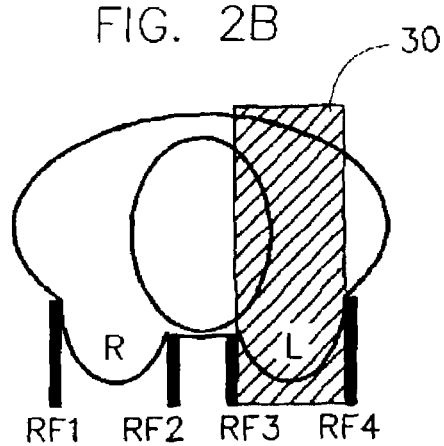
FIG. 2B is a schematic representation of the use of a spectral-spatial RF pulse to selectively invert the magnetization from fat in the left breast.

Referring now to FIG. 2B, the first step in the process is illustrated schematically. In that first step, a spectral-spatial RF pulse is used to selectively invert the magnetization 30 from fat in the left breast L. During application of this RF pulse, the shim currents are set to optimize the field uniformity over the left breast L. The optimized shim currents for the left breast L can be determined prior to the beginning of the pulse sequence, and can be applied not only to the linear shim coils (i.e., gradient coils), but also to any higher order shim coils on the system. In this way, the field uniformity is optimized over the volume that is affected by the spectral-spatial inversion pulse. This results in better homogeneity of fat suppression compared to attempting to optimize the magnetic field uniformity for a larger single volume encompassing both breasts L, R using an average shim setting.

Figure 2C:
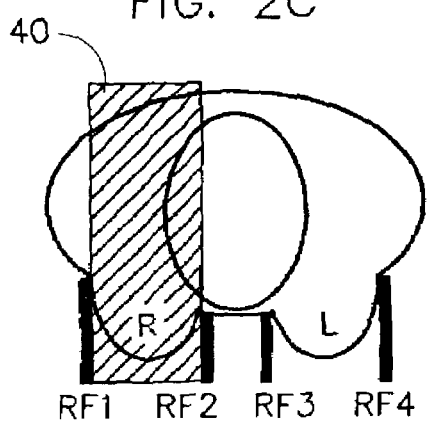
FIG. 2C is a schematic representation of the use of a second spectral-spatial RF pulse to selectively invert the magnetization from fat in the right breast.

FIG. 2C schematically illustrates the next step in the process of the present invention. Following inversion of the magnetization 30 from fat in the left breast L, a second spectral-spatial RF pulse is applied to selectively invert the magnetization 40 from fat in the right breast R. During application of this pulse, shim settings are applied to optimize the field uniformity for the right breast volume. The flip angle of the second inversion pulse is smaller than that used in the first inversion pulse to ensure that the longitudinal fat magnetization 30, 40 from both the left and right breasts L, R reaches a null at the same time point. It should also be mentioned here that the method of the present invention is not constrained by which volume's magnetization is inverted first. Accordingly, it is not necessary to invert the left breast L first.

Figure 2D:
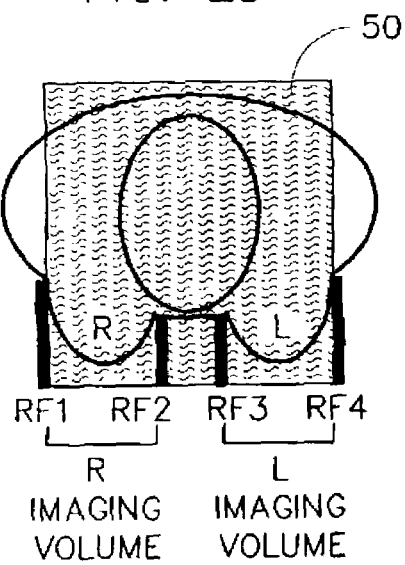
FIG. 2D is a schematic representation of alpha pulses being used to excite the magnetization of both breasts.

FIG. 2D schematically illustrates the next step. During the recovery of the longitudinal fat magnetization, a train of alpha pulses is played out and gradient echoes are phase-encoded and acquired 50. These alpha pulses excite the magnetization in both breasts L, R simultaneously. In the particular example described herein, the alpha pulses are slab-selective, such that the slab encompasses both breasts L, R. However, a coronal slab could be used instead such that the signal from the body above the breast coils is not excited. Alternatively, a non-selective alpha pulse could be used to reduce acquisition time.

Figure 2E:
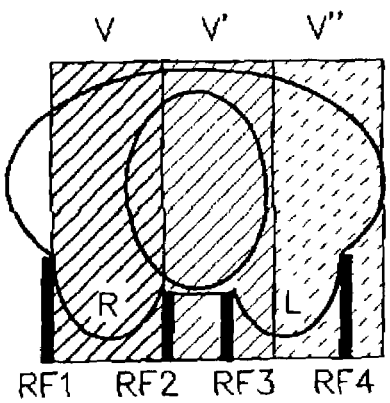
FIG. 2E is a schematic representation of the reconstruction of the volumes relative to the right and left breast.

Referring now to FIG. 2E, the next step in the method is schematically illustrated. As shown in FIGS. 2B–2D and FIG. 3, the pulse sequence encodes the magnetization in such a way that the signal from the left breast L (i.e. from volumes V' and V") is aliased back into the desired volume V, corresponding to the right breast R. This is accomplished by reducing the size of the "receive FOV" relative to the size of the "excited FOV". Specifically, this means that the alpha pulses are designed to excite a large volume encompassing both breasts, but the phase encoding and signal reception are designed to encode and receive from a smaller volume corresponding to a single breast. This results in aliased signal from the contralateral breast back into this smaller received volume. Using the fact that coil elements RF1 and RF2 are more sensitive to the right breast R and coil elements RF3 and RF4 are more sensitive to the left breast L allows reconstruction of the left and right sagittal volumes independently, i.e., it allows the signal from the left and right breasts to be "unaliased." If the coils corresponding to the left and right breasts L, R are perfectly decoupled, i.e. elements RF1 and RF2 only receive signal from the right breast R, it is possible to reconstruct the MR signal from these channels separately from channels RF3 and RF4, resulting in a volume corresponding only to the right breast R. The volume corresponding to the left breast L can be reconstructed from channels RF3 and RF4, with no constraints on the location of its center relative to the volume reconstructed for the right breast R via a phase-shift of the k-space data before Fourier transform. A phase shift in the k-space domain is equivalent to a translation in the image domain.

In the experience of these inventors, and in a realistic situation, it is not possible to count on the coil elements being completely decoupled. Some signal is always received from the opposite breast into each receive channel via inductive coupling between coil elements. This signal must be "decoupled" during image reconstruction if excellent image quality is to be achieved. The correction may be accomplished through a SENSE (or Sensitivity encoding) reconstruction. SENSE is one example of a parallel imaging technique. Parallel imaging techniques are image reconstruction techniques which use the sensitivities of the individual coil elements to reduce scan time. Applying the SENSE algorithm to decouple signals from the coil elements along the L/R direction (i.e. slice encoding direction for this example) allows reconstruction of a large unaliased volume encompassing both breasts L, R. Because the slice encoding direction is along L/R, the slices that correspond to the space between the breasts (i.e. outside of either the desired L and R volumes) can be discarded, leaving the two desired sagittal volumes.

The SENSE correction may be accomplished by solution of the following equations:

$$S_{1,2} = a_L S_L + a_R S_R$$

$$S_{3,4} = b_L S_L + b_R S_R$$

where $S_{1,2}$ is the signal received by receivers 1 and 2 and where $S_{3,4}$ is the signal received by receivers 3 and 4. $S_L$ is the MR signal from the left breast, $S_R$ is the signal from the right breast. The coefficient $a_L$ describes the amount of signal from the left breast that is received by receivers 1 and 2. The coefficient $a_R$ describes the amount of signal from the right breast that is received by receivers 3 and 4. In the case of perfect decoupling, $$a_L = b_R = 0$$

$$a_R = b_L = 1.0.$$

However, typically the coefficient $a_L$, $a_R$, $b_L$, and $b_R$ are spatially varying over the volumes enclosed by the coil elements, transforming the equations into functions of x, y, and z. These equations can be solved on a pixel by pixel basis using a calibration scan that measure the sensitivity profiles of the different receiving coil elements.

One skilled in the art will recognize that if the phase shifting is performed in the post processing instead of at the signal reception stage, this method becomes equivalent to applying SENSE along the slice direction for a large sagittal volume encompassing both breasts.

Figure 3:
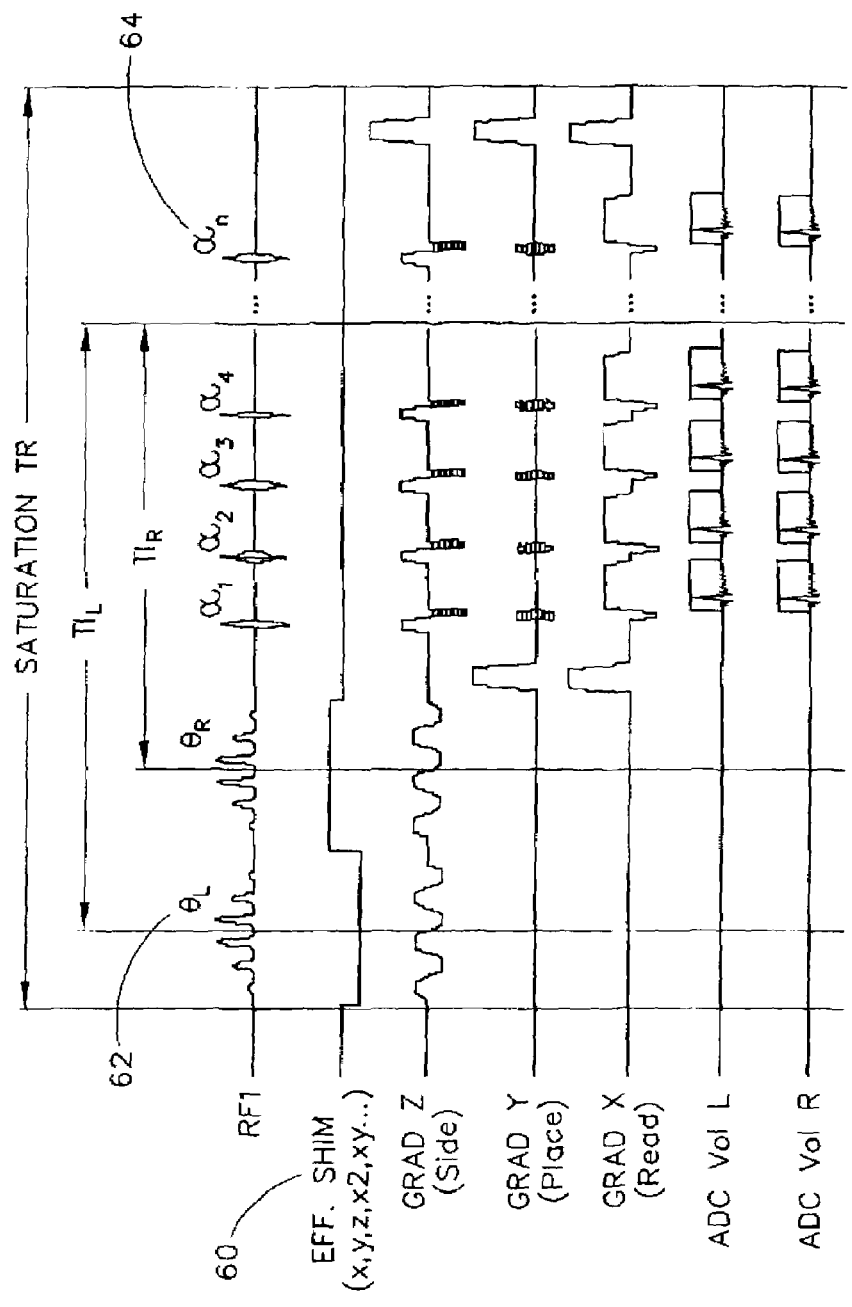
FIG. 3 is a pulse sequence timing diagram for simultaneous image acquisition from two independent fields of view.

Referring now to FIG. 3, a pulse sequence timing diagram for simultaneous image acquisition from two independent fields of view is illustrated. For the breast imaging application described herein, the logical slice direction is along the physical x-axis, i.e. in the left-right direction in the magnet. Spectral-spatial pulses are used to selectively invert the fat magnetization 30, 40 in the left L breast first and the right breast R second. The Effective Shim 60 is the net result of a combination of any number of shim coils that improves the $B_o$ uniformity over the targeted volume. The spectral-spatial RF pulse $\theta_L$ 62 in concert with the effective shim 60 for the left volume, partially inverts the adipose tissue from the left volume. This is then repeated for the right volume with appropriate shim settings. During the train of slab-selective α-pulses 64, the effective shim is an average of the two optimized shim settings.

Figure 4:
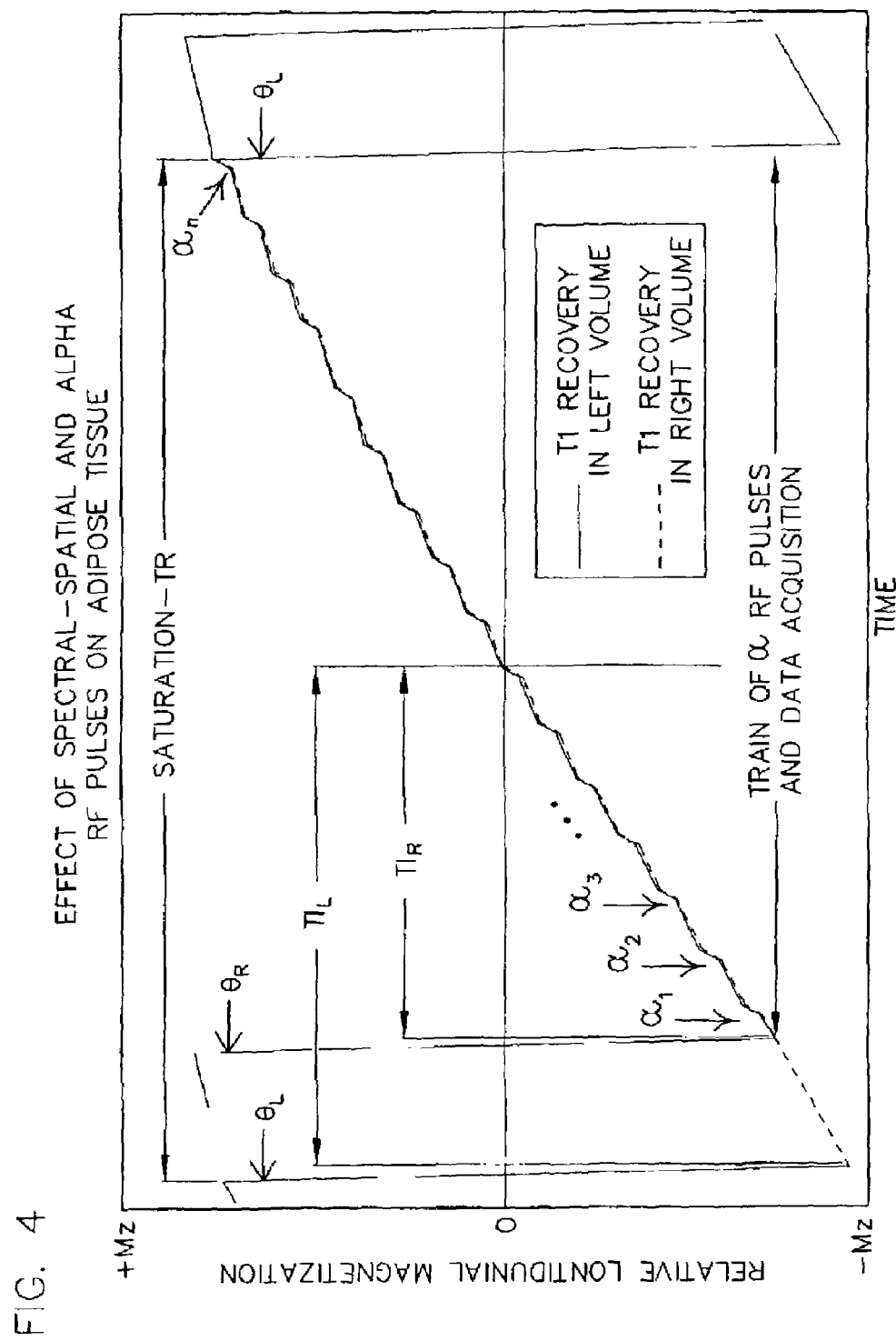
FIG. 4 is a time course diagram of the longitudinal magnetization of adipose tissue during steady state acquisition for the breast imaging example illustrated in FIGS. 1 through 3.

Referring now to FIG. 4, the time course of the longitudinal magnetization of adipose tissue during steady state acquisition for the example of breast imaging is illustrated. The time between $\theta_L$ and $\theta_R$ has been exaggerated for display purposes only. To ensure that each volume has the same tissue contrast, the flip angles $\theta_L$ and $\theta_R$ are determined from the T1 of adipose tissue, the Saturation-TR, the flip angle of the α pulses, the imaging TR, the length of the pulse train (N), and the position of the center k-space line in the recovery period (i.e. where the null point of adipose tissue occurs in the train of pulses).

The MR imaging pulse sequence described herein provides a method for simultaneous data acquisition from more than one independently prescribed volume while providing optimized field uniformity during both the magnetization preparation and data acquisition parts of the acquisition. This acquisition method may be applied to any clinical application where it is desirable to obtain more than one imaging volume simultaneously. The reconstruction part of the invention does not require optimized spin preparation. One specific example described herein is for breast imaging, where it is important to obtain two volumes simultaneously with optimized fat suppression for each volume. It could also be used to provide higher resolution images of both carotid arteries simultaneously following a contrast injection, or for a simultaneous post-contrast study of the liver and pelvis.

The immediate advantage to the MR business of implementing this sequence as product is that it provides a significant improvement for several important clinical applications where contrast agent is injected. Currently, no other vendor offers a comparable product. The particular example of simultaneous breast imaging is important because it provides an optimized method for screening for breast cancer in individuals who are at high risk for developing the disease or for screening the contralateral breast for patients where cancer has been previously detected in one breast. Currently, no other imaging modality besides MR is sensitive to disease in these individuals.

Although the specific example described herein describes the use of inversion pulses for fat suppression in breast, it is possible to use chemsat pulses with optimized shim settings instead. In fact, this method can be used to provide optimized shim settings for any preparation pulse where high magnetic field uniformity during the preparation is desirable.

Another specific example of how this invention could be used is as a method for improving the quality of fat suppression in a large volume. In the particular case where spacing between the multiple volumes is zero (i.e., the volumes are contiguous), the spectral-spatial pulses could be used to selectively invert fat in contiguous volumes for which the shim settings are optimized. It is often easier to optimize the magnet field uniformity in a smaller volume when the susceptibility gradients are large (e.g. near the lungs, or near the sinuses).

What is claimed is:

1. An MR imaging pulse sequence and reconstruction method that comprises the steps of:
   identifying a first imaging volume;
   providing a first coil element sensitive to the first imaging volume identifying a second imaging volume;
   providing a second coil element sensitive to the second imaging volume;
   setting the shim currents to optimize the field homogeneity over the first imaging volume;
   using a first spectral-spatial RF pulse to selectively invert the magnetintion from adipose tissue in the first imaging volume;
   setting the shim currents to optimize the field homogeneity over the second imaging volume;
   using a second spectral-spatial RE pulse to selectively invert the magnetization from adipose tissue in the second imaging volume;
   exciting the magnetization in both imaging volumes simultaneously;
   acquiring the MR data simultaneously from the first and second imaging volumes;
   reconstructing the MR signal from the first imaging volume;
   reconstructing the MR signal from the second imaging volume; and
   using the SENSE algorithm in the slice direction.

2. The method of claim 1 wherein the shim settings are applied to optimize field uniformity to ensure that resonant frequency of the adipose tissue is limited to the bandwidth of the inversion pulse.

3. A method for acquiring MR imaging data simultaneously from more than one independently prescribed volume that comprises the steps of:
   identifying a first sagittal volume;
   providing RF coils sensitive to said first said sagittal volume for acquiring an image from said first sagittal volume;
   setting the shim currents to optimize the field homogeneity over the first sagittal volume;
   using a first spectral-spatial RF pulse to selectively invert the magnetization from adipose tissue in the first sagittal volume,
   identifying a second sagittal volume;
   providing RF coils sensitive to said second said sagittal volume for acquiring an image from said second sagittal volume;
   setting the shim currents to optimize field homogeneity over the second sagittal volume;
   using a second spectral-spatial RF pulse to selectively invert the magnetization from adipose tissue in the second sagittal volume;
   exciting the magnetization in both imaging volumes simultaneously;
   playing out a train of alpha pulses;
   phase encoding and acquiring gradient echoes;
   limiting the field of view of the first RF coil to the first imaging volume;
   limiting the field of view of the second RF coil to the second imaging volume;
   acquiring the MR data simultaneously from the first and second imaging volumes; and
   reconstructing the MR signal using the SENSE algorithm in the slice direction;
   wherein an image corresponding only to the first volume and an image corresponding only to the second volume is reconstructed.

4. The method of claim 3 including the step of setting shim currents to optimize field uniformity aver the second imaging volume prior to the beginning of the pulse sequence wherein filed uniformity is optimized over the volume that is effected by the spectral-spatial pulse.

5. The method of claim 4 wherein the shim settings are applied to optimize field uniformity to ensure that resonant frequency of the adipose tissue is limited to the bandwidth of the inversion pulse.

6. The method of claim 5 wherein the shim settings are applied to optimize field uniformity to ensure that resonant frequency of the adipose tissue is limited to the bandwidth of the inversion pulse.

7. A method for the simultaneous acquisition of high-resolution sagittal volumes in a patient during MR imaging that comprises the steps of:
identifying a plurality of sagittal volumes;
providing at least one RF coil, each of said RF coils being sensitive to a particular sagittal volume and being used for acquiring an image from each of said sagittal volumes;
setting the shim currents to optimize the field homogeneity over each sagittal volume;
sequentially using a spectral-spatial RF pulse to selectively invert the magnetization from adipose tissue in each sagittal volume;
exciting the magnetization in both imaging volumes simultaneously;
playing out a train of alpha pulses; and
phase encoding and acquiring gradient echoes;
limiting the field of view of the first RF coil to the first imaging volume;
limiting the field of view of the second RF coil to the second imaging volume;
acquiring the MR data simultaneously from the first and second imaging volumes;
reconstructing the MR signal using the SENSE algorithm in the slice direction;
wherein an image corresponding to each volume is reconstructed.

8. The method of claim 7 including the step of setting shim currents to optimize field uniformity over each imaging volume prior to the beginning of the pulse sequence wherein field uniformity is optimized aver the volume that is effected by the spectral-spatial pulse.

9. The method of claim 8 wherein the shim settings are applied to optimize field uniformity to ensure that resonant frequency of the adipose tissue is limited to the bandwidth of the inversion pulse.

10. The method of claim 7 wherein the sagittal volumes are breast volumes, carotid arteries, shoulders, hips, temporomandibular joints, separate specimens or multiple samples of any clinical type.

11. A method for acquiring MR imaging data from a patient, said acquisition being conducted simultaneously of two sagittal volumes that may include breast volumes, carotid arteries, shoulders, hips, temporomandibular joints, separate specimens or multiple samples of any clinical type, comprising the steps of:
providing RF coils sensitized to the first sagittal volume for acquiring an image from said first sagittal volume inverting the magnetization from adipose tissue in the first sagittal volume with a first spectral-spatial RF pulse; setting the shim currents to optimize the field homogeneity over the first sagittal volume;
providing RF coils sensitized to the second sagittal volume for acquiring an image from said second sagittal volume inverting the magnetization from adipose tissue in the second sagittal volume with a second spectral-spatial RF pulse, setting the shim currents to optimize the field homogeneity over the second sagittal volume; exciting the magnetization in the first and second imaging volumes simultaneously using a train of alpha pulses;
decoupling the RF coils sufficiently that the first volume coils receive signal only from the first volume and the second volume coils receive signal only from the second volume;
acquiring the MR data simultaneously from the first and second imaging volumes; and reconstructing the MR signal;
wherein an image corresponding only to the first volume and an image corresponding only to the second volume is reconstructed.

12. A method for acquiring MR imaging data from a patient, said acquisition being conducted simultaneously of two sagittal volumes that may include breast volumes, carotid arteries, shoulders, hips, temporomandibular joints, separate specimens or multiple samples of any clinical type, comprising the steps of:
providing one or more RF coil elements sensitized to the first sagittal volume for acquiring an image from said first sagittal volume;
identifying a second sagittal volume;
providing one or more RF coil elements sensitized to the first sagittal volume for acquiring an image from said second sagittal volume inverting the magnetization from adipose tissue in the first sagittal volume with a first spectral-spatial RF pulse; setting the shim currents to optimize the field homogeneity over the first sagittal volume;
inverting the magnetization from adipose tissue in the second sagittal volume with a second spectral-spatial RF pulse; setting the shim currents to optimize field homogeneity over the second sagittal volume; exciting the magnetization in the first and second imaging volumes simultaneously using a train of alpha pulses;
recovering the longitudinal magnetization of adipose tissue;
decoupling the RF coils sufficiently that the first volume elements receive signal only from the first volume and the second volume elements receive signal only from the second volume; and
reconstructing the MR signal;
wherein an image corresponding only to the first volume and an image corresponding only to the second volume is reconstructed.

* * * * *